United States Patent
Meyer (10) Patent No.: US 7,558,612 B2
(45) Date of Patent: Jul. 7, 2009

(54) MOTION COMPENSATED SPIRAL FISP MRI

(75) Inventor: Craig H. Meyer, Charlottesville, VA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 998 days.

(21) Appl. No.: 10/124,632

(22) Filed: Apr. 16, 2002

(65) Prior Publication Data

US 2003/0193337 A1   Oct. 16, 2003

(51) Int. Cl.
*A61B 5/05* (2006.01)

(52) U.S. Cl. ................................ 600/410; 600/419
(58) Field of Classification Search .............. 600/410, 600/419; 324/307, 309, 306
See application file for complete search history.

(56) References Cited

U.S. PATENT DOCUMENTS

| | | | | | |
|---|---|---|---|---|---|
| 4,665,365 | A | * | 5/1987 | Glover et al. | 324/309 |
| 4,731,583 | A | * | 3/1988 | Glover et al. | 324/309 |
| 4,973,906 | A | * | 11/1990 | Bernstein | 324/309 |
| 5,233,301 | A | * | 8/1993 | Meyer et al. | 324/309 |
| 5,280,244 | A | * | 1/1994 | Hinks | 324/306 |
| 5,485,086 | A | * | 1/1996 | Meyer et al. | 324/307 |
| 6,011,392 | A | * | 1/2000 | Zhou et al. | 324/309 |
| 6,020,739 | A | * | 2/2000 | Meyer et al. | 324/309 |
| 6,167,293 | A | * | 12/2000 | Chenevert et al. | 600/420 |
| 6,185,447 | B1 | * | 2/2001 | Alley et al. | 600/420 |
| 6,291,997 | B1 | * | 9/2001 | King et al. | 324/319 |
| 6,307,368 | B1 | * | 10/2001 | Vasanawala et al. | 324/309 |
| 6,538,443 | B2 | * | 3/2003 | Morich et al. | 324/318 |
| 6,556,856 | B1 | * | 4/2003 | Mistretta et al. | 600/420 |
| 6,636,038 | B1 | * | 10/2003 | Heid | 324/314 |
| 6,677,750 | B2 | * | 1/2004 | Hennig et al. | 324/307 |
| 6,714,807 | B2 | * | 3/2004 | Zur | 600/410 |
| 6,794,870 | B2 | * | 9/2004 | Hennig | 324/307 |
| 6,819,104 | B2 | * | 11/2004 | Yamazaki et al. | 324/307 |
| 6,906,516 | B2 | * | 6/2005 | Bangerter et al. | 324/309 |
| 6,983,181 | B2 | * | 1/2006 | Hinks et al. | 600/410 |
| 7,034,533 | B2 | * | 4/2006 | Mugler et al. | 324/309 |
| 7,046,004 | B2 | * | 5/2006 | Bieri et al. | 324/307 |
| 7,164,268 | B2 | * | 1/2007 | Mugler, III et al. | 324/307 |
| 2002/0111549 | A1 | * | 8/2002 | Wang | 600/407 |

(Continued)

OTHER PUBLICATIONS

Hargraves, et. al, "Fast Three-Dimensional Spiral Imaging", 2000, Proc. Intl. Soc. Mag. Reson. Med., vol. 8, p. 1509.*

(Continued)

*Primary Examiner*—Brian Casler
*Assistant Examiner*—Amanda L. Lauritzen
(74) *Attorney, Agent, or Firm*—Beyer Law Group LLP (57) ABSTRACT

Real-time imaging of a moving object such as the heart uses fast imaging with steady precession (FISP) traversing spirals in k-space. After flipping nuclear spins in the object within a slice to be imaged, signals are read out from the nuclear spins while applying read-out magnetic field gradients whereby read-out signals traverse spirals in k-space. Thereafter, the zero moment and first moment of the read-out gradients are driven to zero quickly so that fast imaging with steady state precession is realized without banding artifacts. Motion compensated rewinders are applied after the read-out magnetic field gradients which can be integral with the read-out gradients or comprise separate compensation lobes.

24 Claims, 13 Drawing Sheets

U.S. PATENT DOCUMENTS

| | | | |
|---|---|---|---|
| 2004/0254452 A1* | 12/2004 | Judd et al. | 600/419 |
| 2005/0077895 A1* | 4/2005 | Hargreaves et al. | 324/307 |
| 2006/0036161 A1* | 2/2006 | Hinks et al. | 600/415 |
| 2006/0161060 A1* | 7/2006 | Pai | 600/431 |
| 2007/0038073 A1* | 2/2007 | Mistretta | 600/410 |

OTHER PUBLICATIONS

Zur Y, Wood ML, Neuringer LJ. Motion-insensitive, steady-state free precession imaging. Magnetic Resonance in Medicine 16: 444-459 (1990).*

Nayak KS, Hargreaves BA, Hu B, Nishimura DG, Pauly JM, Meyer CH. Spiral balanced steady-state free precession cardiac imaging. Magnetic Resonance in Medicine 53: 1468-1473 (2005).*

Kim Dong-Hyun, Daniel M. Spielman. Reducing gradient imperfections for spiral magnetic resonance spectroscopic imaging. Magmetic Resonance in Medicine 56: 198-203, 2006.*

Heid, O., "True FISP Cardiac Fluoroscopy," *ISMRM*, 320, 1997.

Kerr, A.B. et al., "Real-Time Interactive MRI on a Conventional Scanner," *MRM*, 38:355-367, 1997.

Yang, P.C. et al., New Real-Time Interactive Cardiac Magnetic Resonance Imaging System Complements Echocardiography, *JACC*, 32: 2049-56, 1998.

Hargreaves, B.A. et al., "Fast Three-Dimensional Spiral Imaging," *ISMRM*, 1509, 2000.

Meyer, C.H. et al., "Real-Time Spiral SSFP Cardiac Imaging," *ISMRM*, 442, 2001.

* cited by examiner

MOTION COMPENSATED SPIRAL FISP MRI

STATEMENT AS TO RIGHTS TO INVENTIONS MADE UNDER FEDERALLY SPONSORED RESEARCH OR DEVELOPMENT

This invention was made with Government support under contract HL39297 awarded by the National Institutes of Health. The Government has certain rights in this invention.

BACKGROUND OF THE INVENTION

This invention relates generally to magnetic resonance imaging (MRI), and more particularly the invention relates to the use of fast imaging with steady precession (FISP) and with motion compensated spiral k-space trajectories.

In cardiac imaging using MRI techniques, rapid acquisition of MRI signals is desired. MR ventriculography is often performed in a gated mode using conventional gradient echo 2DFT techniques. These techniques often suffer from inadequate signal and inadequate contrast between blood and myocardium. Recently, MR scanners have been including a modification of these techniques using steady-state free precession (SSFP) or "FISP" techniques, which refocus all gradient lobes between excitations to preserve transverse magnetization for a longer time. These techniques lead to increased signal and increased blood-myocardium contrast, but cardiac-gating and breath-holding are still required to get good spatial and temporal resolution, because of the inherent inefficiencies of 2DFT scanning.

Fluoroscopic ventriculography is advantageous because cardiac gating and breath-holding are not needed and because it can be used in a real-time interactive mode, similar to echocardiography. Fluoroscopic ventriculography requires an efficient scanning technique, such as spiral scanning. However, conventional spiral ventriculography sometimes suffers from inadequate contrast between blood and myocardium and inadequate signal.

It would be advantageous to use spiral k-space scanning techniques to improve image contrast. However, current spiral scanning techniques use a repetition time (TR) of 25-40 ms, because of long spectral-spatial excitation pulses used for fat suppression and because longer readouts allow for increased scan efficiency. On the other hand, FISP techniques require short repetition times, on the order of 2-6 ms, since with longer repetition times image banding occurs due to field inhomogeneity. Thus, spiral ventriculography and FISP techniques would appear to be incompatible.

The present invention is directed to the practical use of FISP techniques and spiral k-space scanning in motion compensated cardiac imaging.

BRIEF SUMMARY OF THE INVENTION

In accordance with the invention, spiral scanning with reduced repetition time is combined with FISP MRI acquisition sequences. The shorter TR prevents FISP banding artifacts in the images.

A feature of the invention is the design of spiral magnetic field gradients whereby k-space is scanned in a very short readout period. The gradients are then returned to zero amplitude in a manner to eliminate gradient moments. The zero moment must be zeroed out for all applications in order to maintain SSFP or FISP coherence. For ventriculography applications, the first moment must also be zeroed out to avoid image artifacts from moving structures or flowing blood.

To zero out both the zero and first moments in a conventional manner would require a number of additional gradient lobes, which could push the repetition time, TR, up so that FISP image banding artifacts appear. It would also increase higher order moments significantly. In accordance with one feature of the invention an optimized k-space rewinder is provided that simultaneously nulls the zeroth and first moments while returning the gradient amplitude to zero.

The invention and objects and features thereof will be more readily apparent from the following detailed description and appended claims when taken with the drawings.

DETAILED DESCRIPTION OF THE INVENTION

Figure 1:
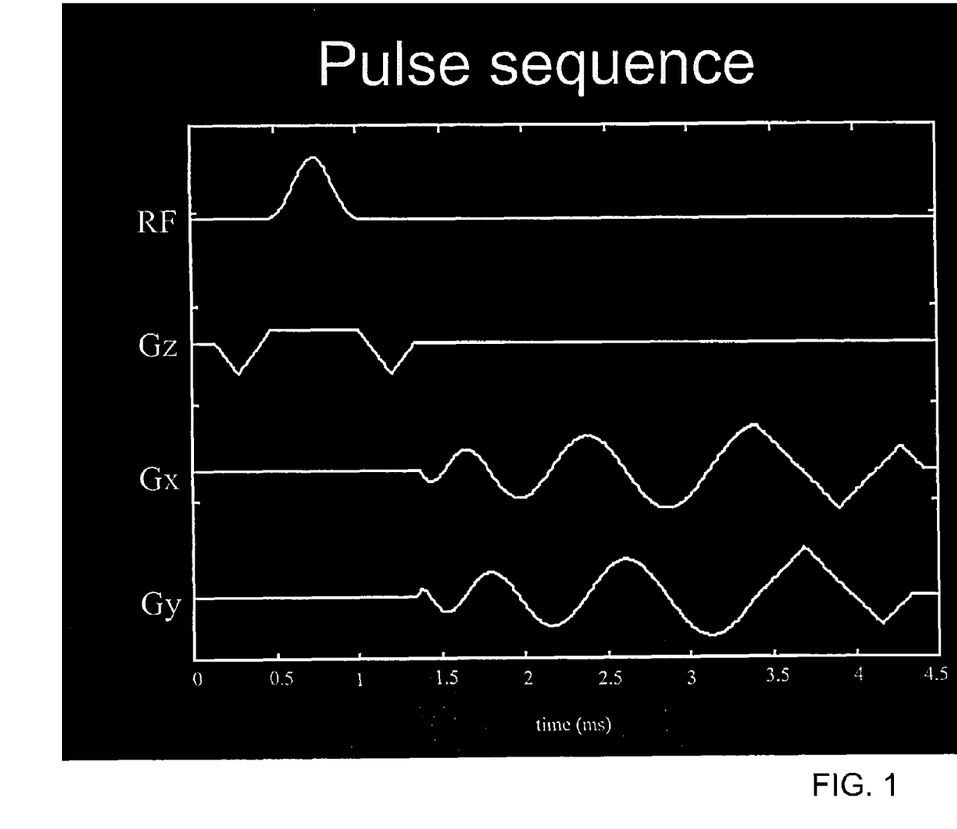
FIG. 1 illustrates an excitation pulse and magnetic field gradients for real-time spiral SSFP (FISP) cardiac imaging in accordance with an embodiment of the invention.

Referring now to the drawings, FIG. 1 illustrates a pulse sequence in accordance with the invention for combining the contrast of SSFP (FISP) with the efficiency of spiral k-space scanning. An RF pulse is applied in combination with $G_z$ gradient pulses for tilting nuclear spins in an object of interest with slide selection determined by the $G_z$ gradient. Signals from the precession of the tilted nuclear spins are read out in the presence of $G_x$ and $G_y$ gradients. Each of the $G_x$ and $G_y$ gradients includes at the end thereof a rewinder with built-in motion compensation which optimizes for a minimum repetition time, TR, for decreased scan time and decreased sensitivity to inhomogeneity. Further, higher order moments are reduced to thereby reduce sensitivity to acceleration.

Figure 2A:
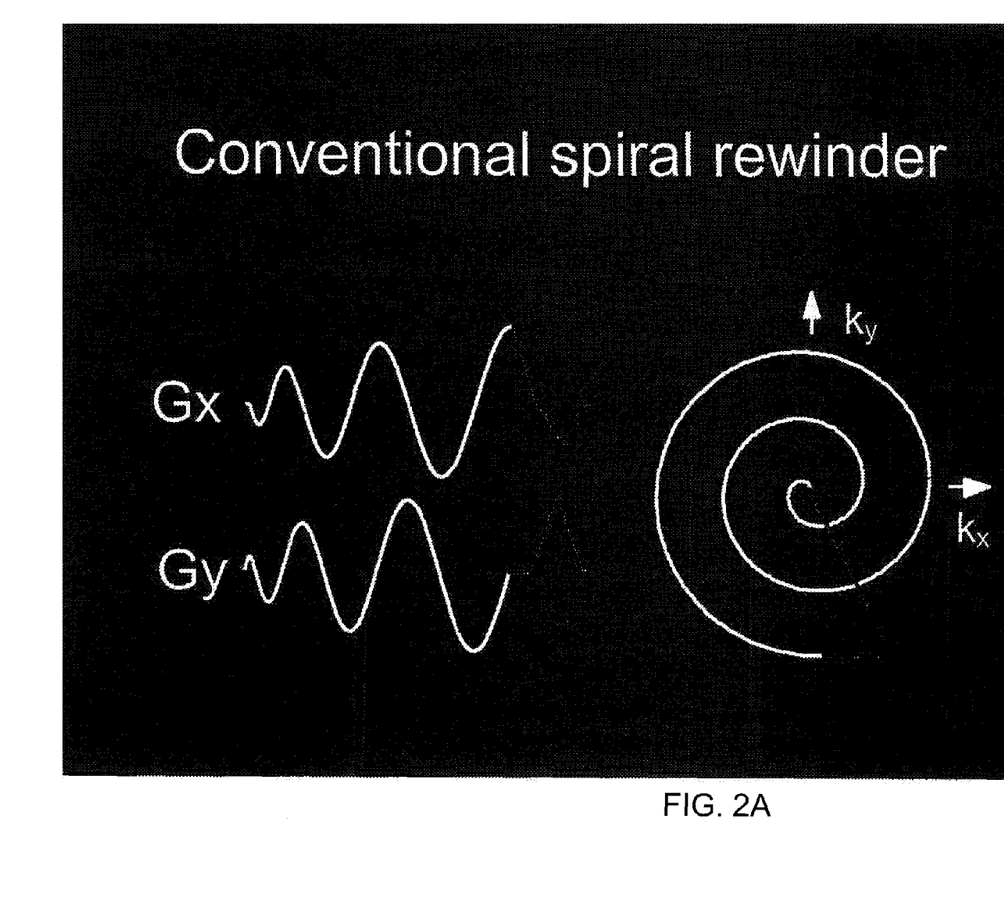
FIGS. 2A and 2B illustrate a conventional magnetic field gradient spiral rewinder and a rewinder with a separate bipolar for motion compensation.
Figure 2B:
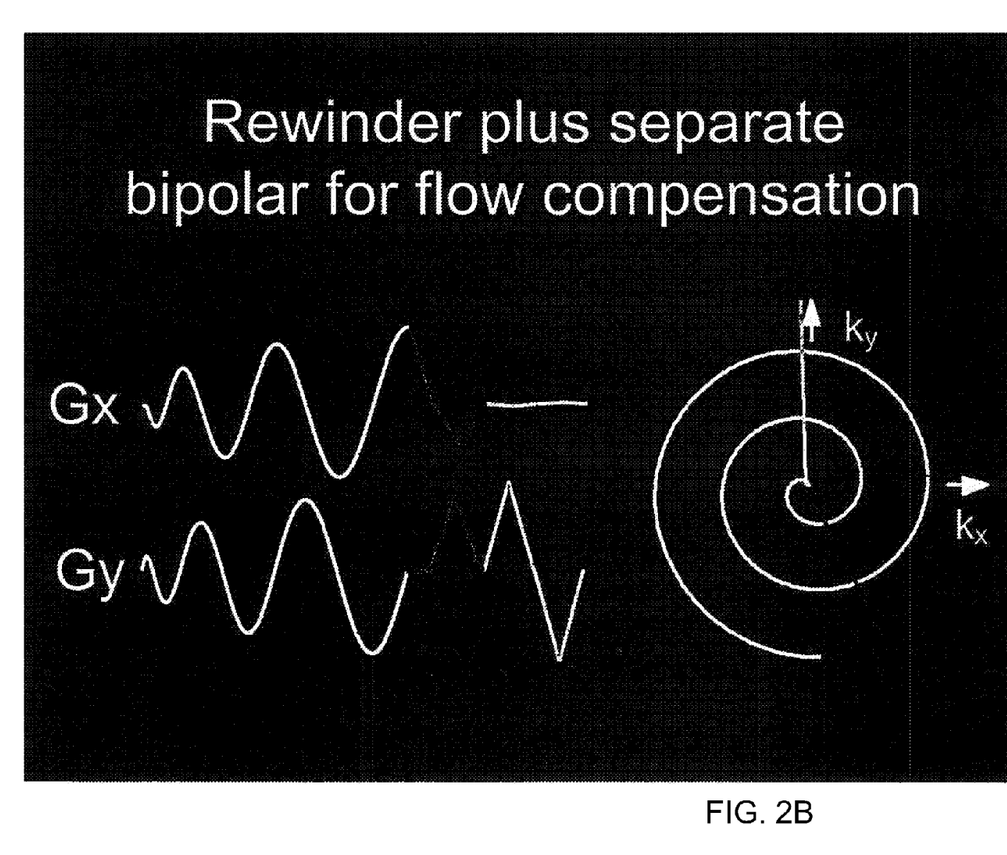
Figure 3:
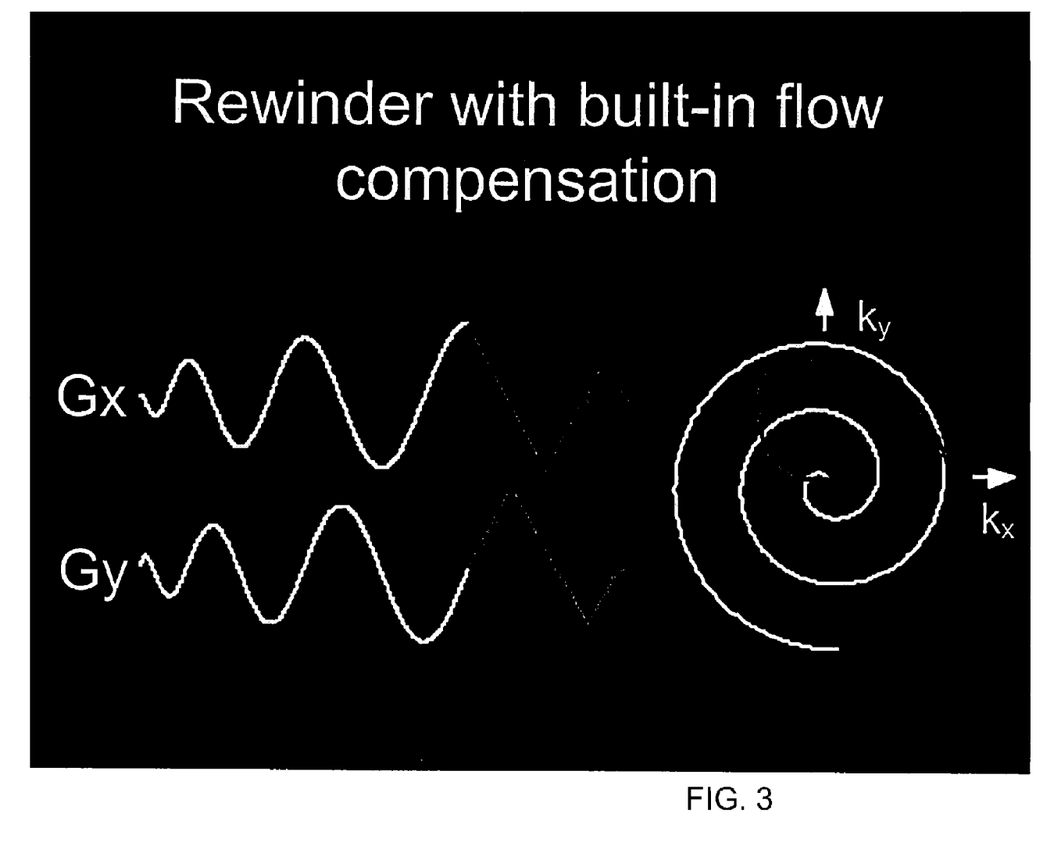
FIG. 3 illustrates a magnetic field gradient with built-in motion compensation in accordance with an embodiment of the invention.

Conventionally, spiral rewinders are provided with $G_x$ and $G_y$ gradients to bring the k-space scan back to the k-space origin as shown in FIG. 2A. Further, a spiral rewinder plus separate bipolar portions have been provided for motion compensation as shown in FIG. 2B. However, in accordance with the invention the rewinder for the $G_x$ and $G_y$ gradients as shown in FIG. 3 has built-in motion compensation which is optimized for a minimum repetition time and decreased scan time and provides decreased sensitivity to inhomogeneity.

Further, the zero and first order moments are nulled to zero while higher order moments are reduced for a reduced sensitivity to acceleration.

For the motion compensated rewinder design, each of the x and y rewinders are separately optimized for a constant slew rate, S. The time origin for the moment calculations is at the end of readout which is the start of the rewinder.

The values of the zero moment and first moment of the readout gradient waveforms are given as follows:

$$M_0 = \int_{-T}^{0} G(t)dt \quad M_1 = \int_{-T}^{0} tG(t)dt$$

In order to null these moments, the rewinder gradient waveforms must have moments that are the inverse of those of the preceding readout gradient waveforms, with the same time reference at the start of the rewinder.

Figure 4A:
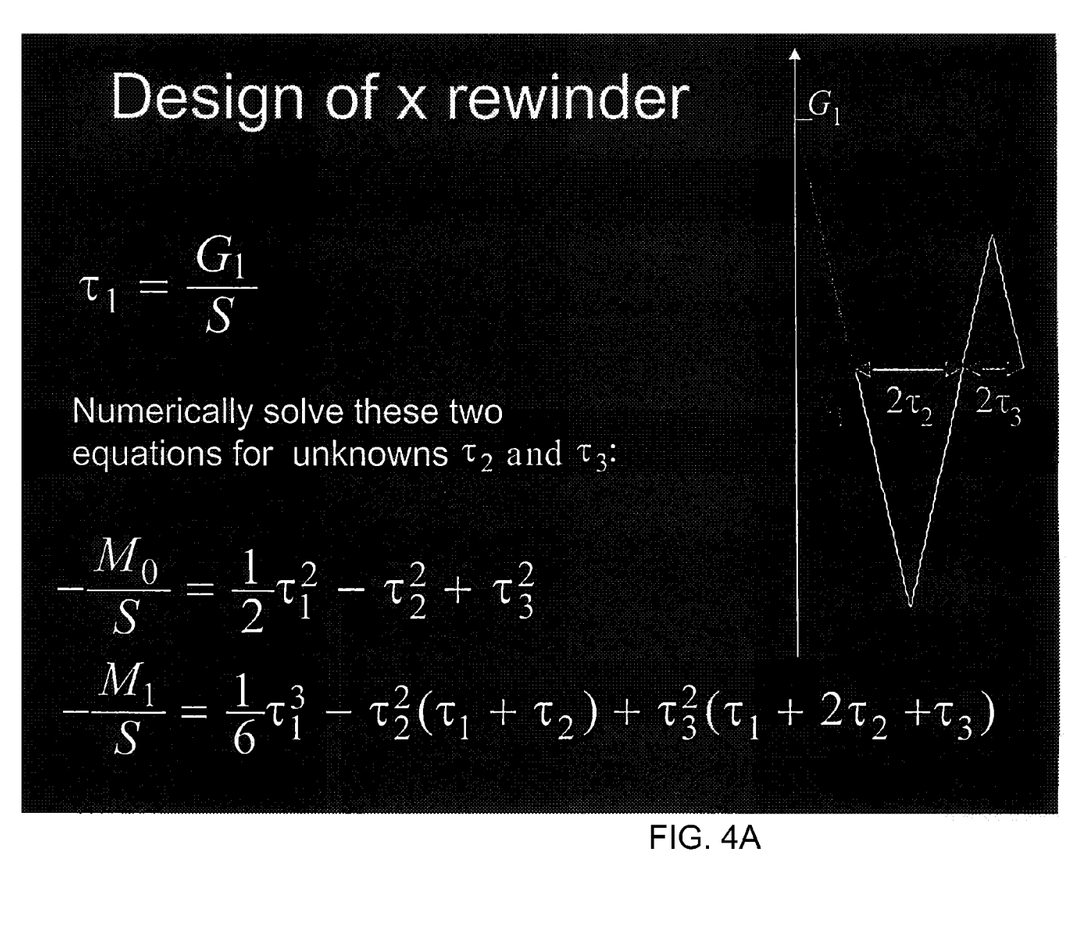
FIGS. 4A, 4B illustrate the design of an x-gradient rewinder and a y-gradient rewinder in accordance with an embodiment of the invention.

Before starting the design of the rewinders, for ease of calculation we first rotate the spiral readout gradients to assume the general form shown in FIG. 4, wherein the Gy gradient has approximately zero magnitude. At this point, typically the Gx gradient is near its maximum magnitude. If desired, the gradients can be rotated back to their original position after the rewinder lobes are added. In designing the x-rewinder shown in FIG. 4, the values of $\tau_1$, $\tau_2$, and $\tau_3$ in the following equations are solved:

$$\tau_1 = \frac{G_1}{S}$$
$$-\frac{M_0}{S} = \frac{1}{2}\tau_1^2 - \tau_2^2 + \tau_3^2$$
$$-\frac{M_1}{S} = \frac{1}{6}\tau_1^3 - \tau_2^2(\tau_1 + \tau_2) + \tau_3^2(\tau_1 + 2\tau_2 + \tau_3).$$

Figure 4B:
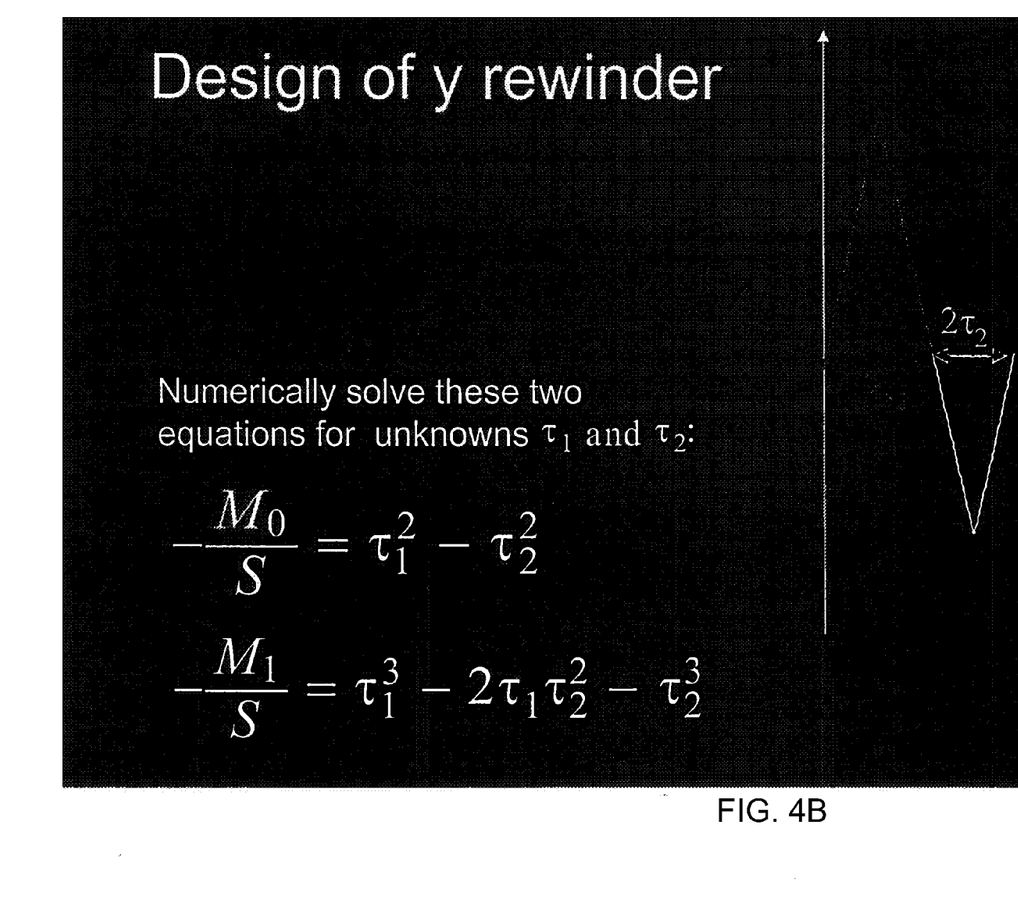

The y-rewinder as shown in FIG. 4B has unknowns $\tau_1$ and $\tau_2$ which are solved as follows:

$$-\frac{M_0}{S} = \tau_1^2 - \tau_2^2$$
$$-\frac{M_1}{S} = \tau_1^3 - 2\tau_1\tau_2^2 - \tau_2^3.$$

The x and y rewinders as calculated above provide zero first and second moments to maintain coherence and to avoid build-up of motion sensitivity over multiple repetition times.

FIGS. 5-11 are images of several patients under different imaging conditions. The images were obtained using a 1.5T GE Signa CV/I scanner using 40 mT/m gradients with 150 T/m/s slew rate. A repetition time of 4.5 ms with a flip angle of 60° and slice width of 5-10 mm was employed with 20 spiral k-space interleaves. Eleven true frames per second were obtained with a field of view of 24 cm and 2.35 mm spatial resolution.

Figure 5A:
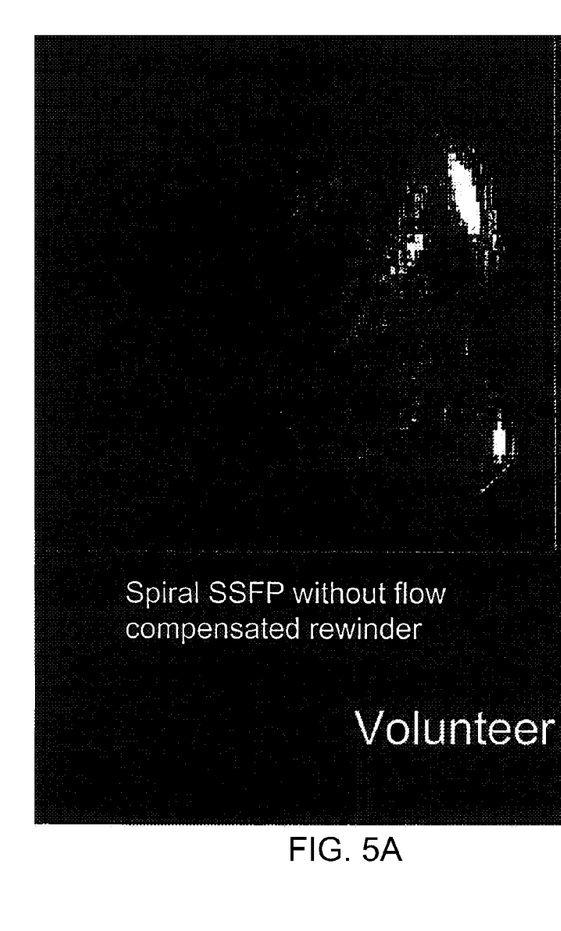
FIGS. 5A, 5B illustrate spiral SSFP images without and with a motion compensated rewinder.
Figure 5B:
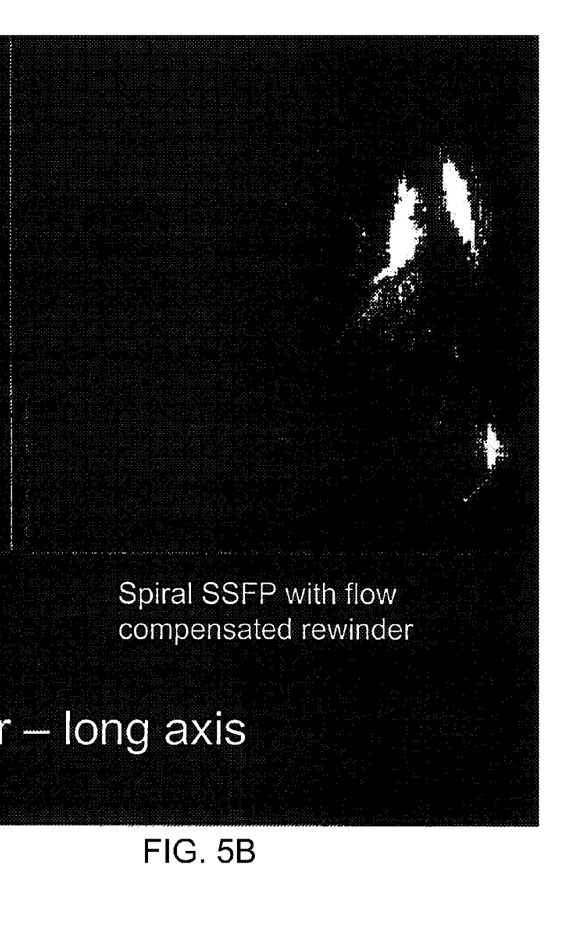
Figure 6A:
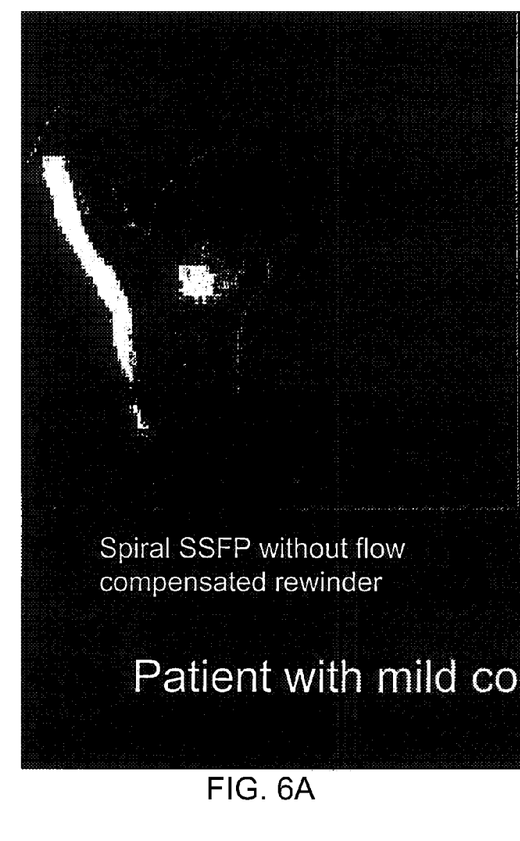
FIGS. 6A, 6B are spiral SSFP images without and with motion compensated rewinders for a patient with mild coronary artery disease.
Figure 6B:
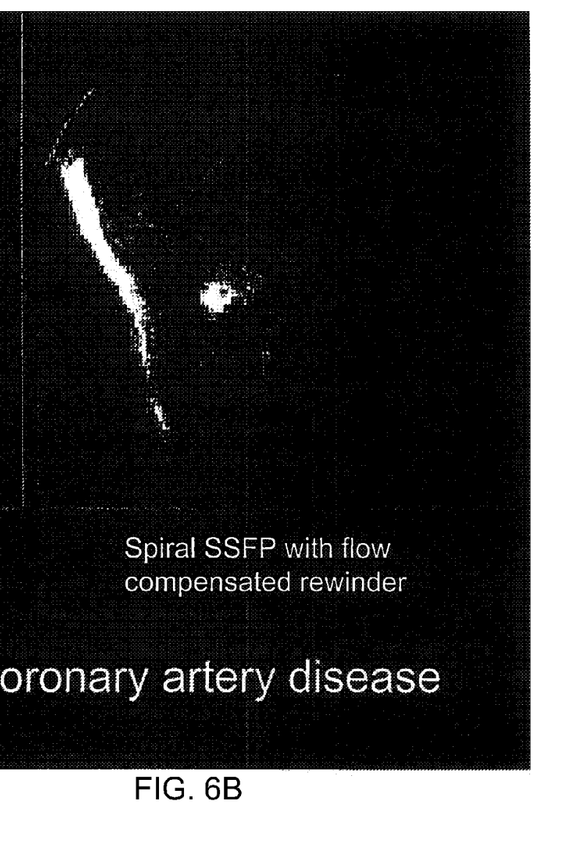

FIGS. 5A and 5B are images of a volunteer along the long axes using spiral SSFP without a motion compensated rewinder and with a motion compensated rewinder in accordance with the invention. FIGS. 6A, 6B are images of a patient with mild coronary artery disease with spiral SSFP without a motion compensated rewinder and spiral SSFP with motion compensated rewinder. Improved image quality is noted in FIG. 6B using spiral SSFP with a motion compensated rewinder in accordance with the invention.

Figure 7A:
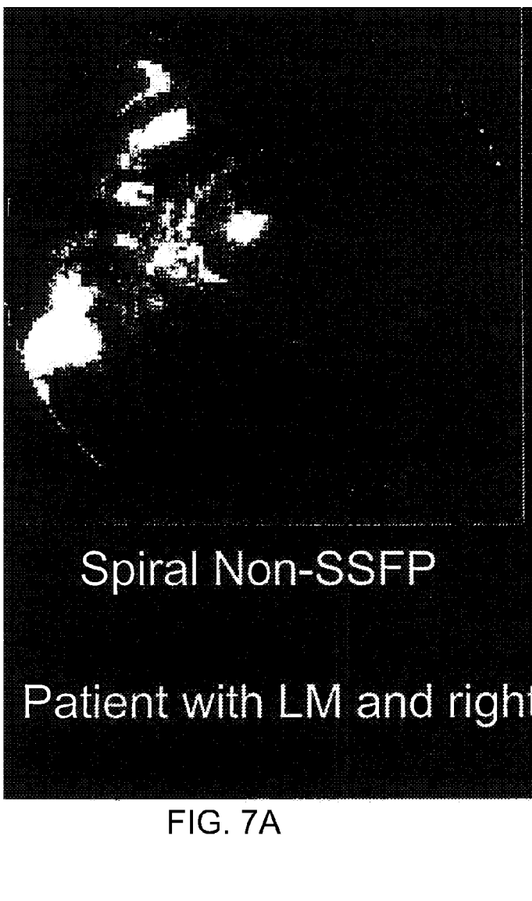
FIGS. 7A, 7B illustrate spiral non-SSFP and spiral SSFP images of a patient with left main and right coronary artery disease.
Figure 7B:
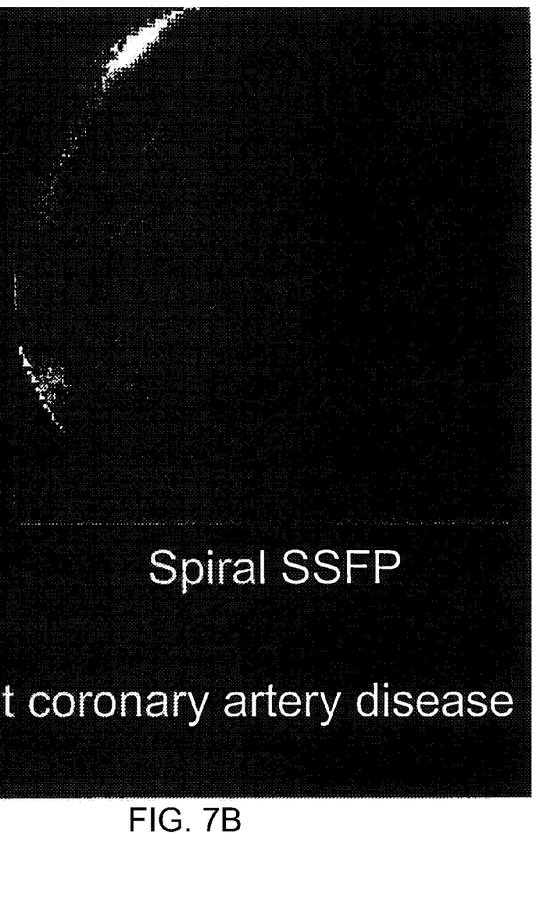
Figure 8A:
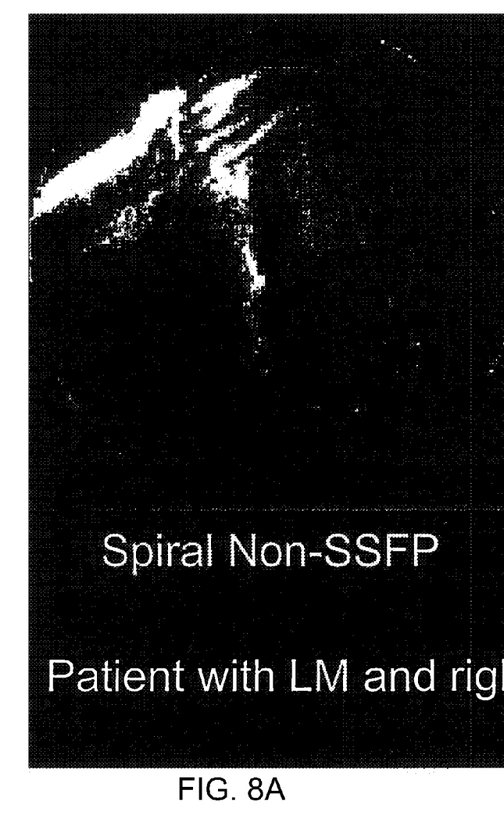
FIGS. 8A, 8B are spiral non-SSFP and spiral SSFP images of a patient with left main and right coronary artery disease.
Figure 8B:
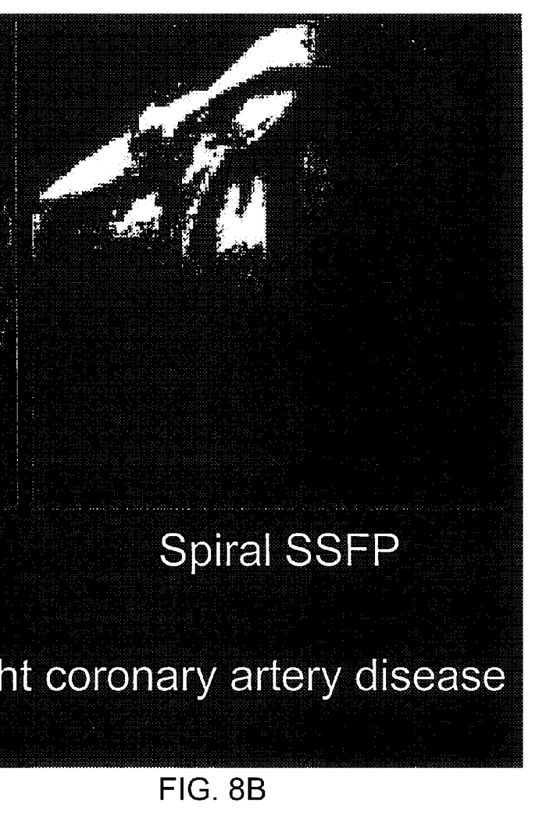
Figure 9A:
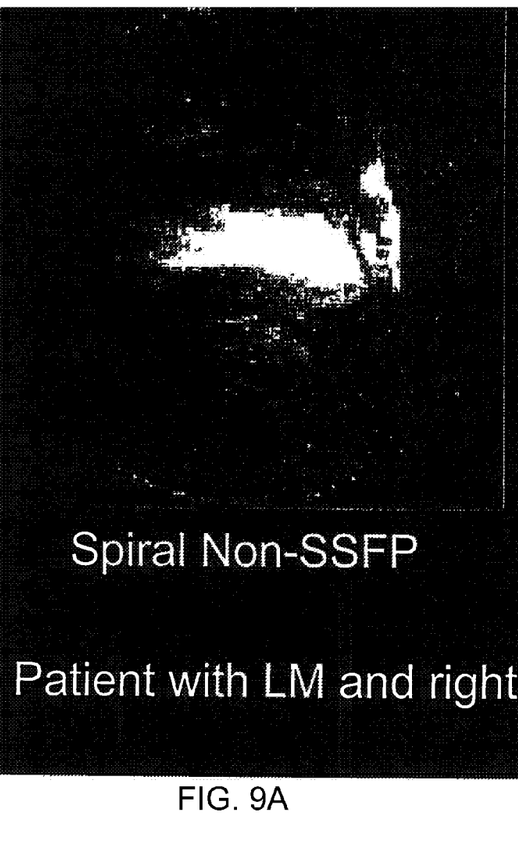
FIGS. 9A, 9B are spiral non-SSFP and spiral SSFP images of a patient with left main and right coronary artery disease.
Figure 9B:
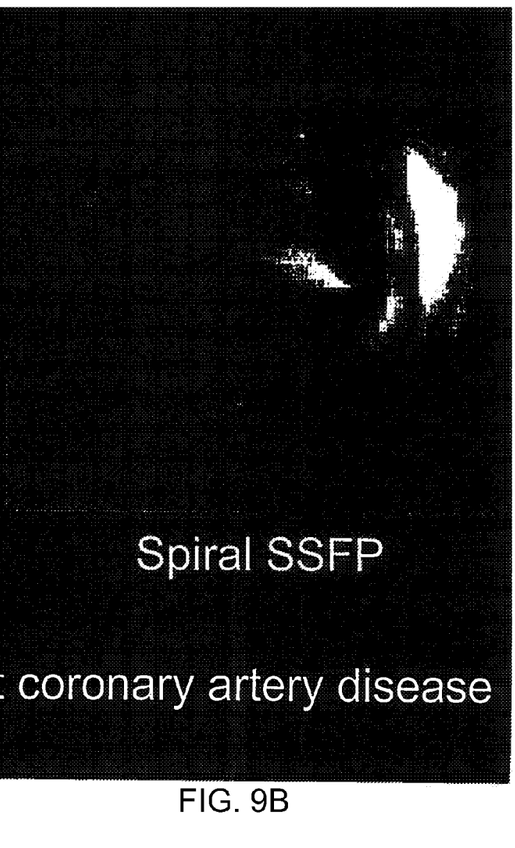

Comparison of the invention with non-SSFP spiral sequences was also obtained using 21 mT/m maximum gradient with 120 T/m/s slew rate. The repetition time, TR, was 30 ms with a flip angle of 30° and slice width of 7 mm. Six spiral interleaves were obtained with 5.6 true frames/s and 16 frames/s with a sliding window. The field of view was 24 cm with 2.24 mm spatial resolution. FIGS. 7A, 7B illustrate a patient with left main and right coronary artery disease using spiral non-SSFP imaging and spiral SSFP in accordance with the invention, respectively. FIGS. 8A, 8B are also images of the patient with right coronary artery disease using spiral non-SSFP imaging and spiral SSFP imaging in accordance with the invention, respectively. Similarly, FIGS. 9A, 9B are images using spiral non-SSFP imaging and spiral SSFP imaging of the patient with right coronary artery disease.

Figure 10A:
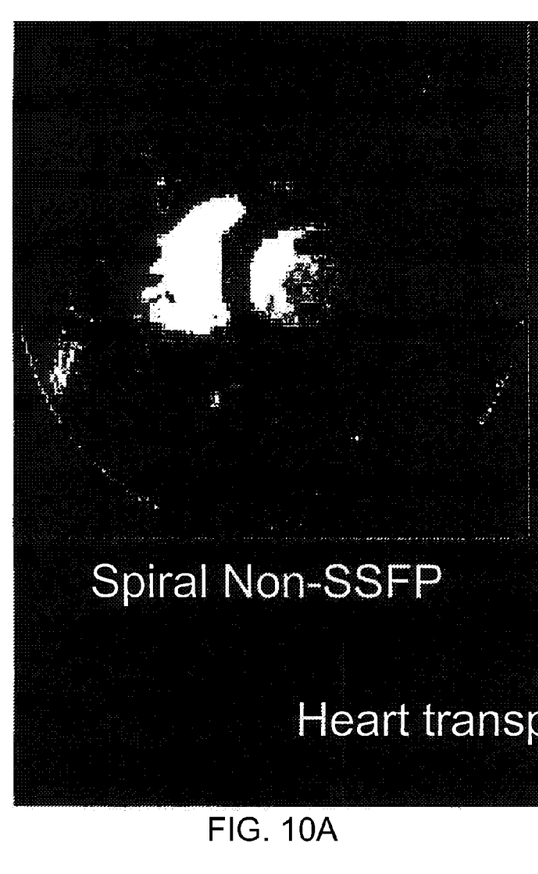
FIGS. 10A, 10B are spiral non-SSFP and spiral SSFP images of a heart transplant patient.
Figure 10B:
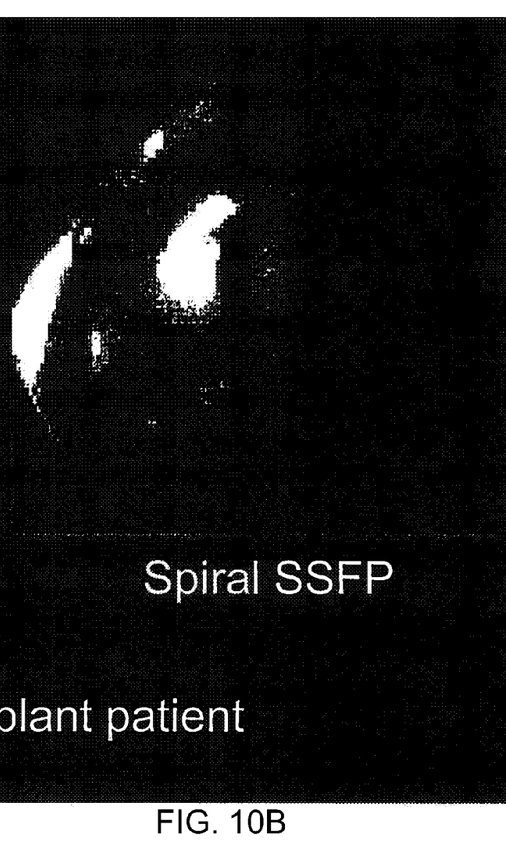
Figure 11A:
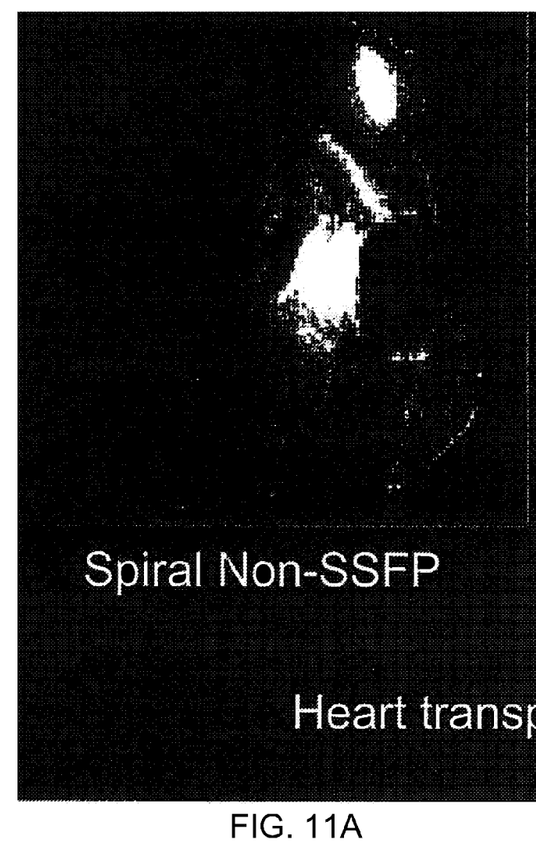
FIGS. 11A, 11B are spiral non-SSFP and spiral SSFP of the heart transplant patient.
Figure 11B:
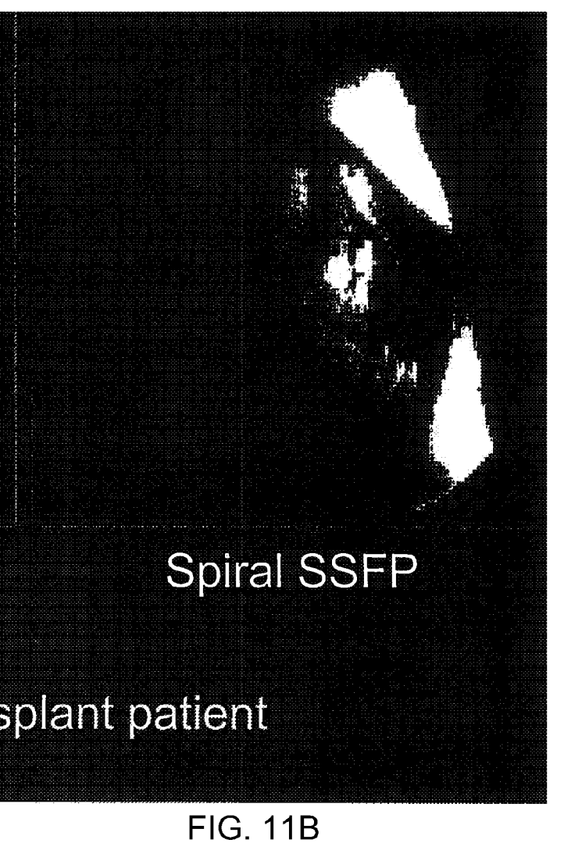

FIGS. 10A, 10B are images of a heart transplant patient using spiral non-SSFP imaging and spiral SSFP imaging in accordance with the invention, and FIGS. 11A, 11B are other images of the heart transplant patient using spiral non-SSFP and spiral SSFP, respectively.

By employing gradient rewinders with built-in motion compensation in accordance with the invention, real-time cardiac imaging sequences utilize the contrast of SSFP, the speed of FISP, along with the efficiency of k-space spiral scanning. Image banding is avoided by keeping the repetition time short through optimized gradient waveform design. SSFP coherence is maintained by driving the zeroth gradient moments to zero. Motion and flow artifacts are reduced by driving the first gradient moments to zero and reducing higher order moments. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of imaging in an object using magnetic resonance comprising the steps of:
    a) flipping nuclear spins in the object within a slice to be imaged in a magnetic resonance apparatus,
    b) reading out signals from the nuclear spins while applying read-out magnetic field gradients whereby read-out signals traverse spirals in k-space,
    c) driving the zero moment and first moment of the read-out gradients to zero after reading out signals whereby fast imaging with steady precession (FISP) is realized without banding artifacts, by applying spiral rewinders with built-in motion compensation to the read-out gradients, which are motion compensated rewinders; and
    d) obtaining an image of the object from the fast imaging.

2. The method as defined by claim 1 wherein the imaging is cardiac imaging.

3. The method as defined in claim 1, wherein the imaging is in real time.

4. The method as defined by claim 1 wherein step c) applies the motion compensated rewinders after the read-out magnetic field gradients.

5. The method as defined by claim 4 wherein the motion compensated rewinders are integral with the read-out gradients.

6. The method as defined by claim 4 wherein the motion compensated rewinders comprise separate compensation lobes.

7. The method as defined by claim 4 wherein one rewinder is designed for a constant slew rate, S, a zero moment, $-M_0$, a first moment, $-M_1$, and with a time origin at the end of read-out and zero value spacing of $\tau_1$, $2\tau_2$, and $2\tau_3$ where $$\tau_1 = \frac{G_1}{S}$$
$$-\frac{M_0}{S} = \frac{1}{2}\tau_1^2 - \tau_2^2 + \tau_3^2$$
$$-\frac{M_1}{S} = \frac{1}{6}\tau_1^3 - \tau_2^2(\tau_1 + \tau_2) + \tau_3^2(\tau_1 + 2\tau_2 + \tau_3).$$

8. The method as defined by claim 7 wherein another rewinder is designed for a constant slew rate, S, with a time origin at the end of read-out and zero value spacing of $2\tau_1$ and $2\tau_2$ where $$-\frac{M_0}{S} = \tau_1^2 - \tau_2^2$$
$$-\frac{M_1}{S} = \tau_1^3 - 2\tau_1\tau_2^2 - \tau_2^3.$$

9. The method as defined by claim 8 wherein the zero moment, $M_0$, is:

$$M_0 = \int_{-T}^{0} G(t)\,dt$$

and the first moment, $M_1$, is:

$$M_1 = \int_{-T}^{0} tG(t)\,dt.$$

10. The method as defined by claim 9 wherein the motion compensated rewinders are integral with the read-out gradients.

11. The method as defined by claim 9 wherein the motion compensated rewinders comprise separate compensation lobes.

12. The method as defined by claim 8 wherein flip angle is 60°, repetition time is 4.5 ms, imaged slice is 5-10 mm, and read-out gradients are 40 mT/m with 150 T/m/s slew rate.

13. Apparatus for imaging in an object using magnetic resonance comprising:
 a) means for flipping nuclear spins in the object within a slice to be imaged,
 b) means for reading out signals from the nuclear spins while applying read-out magnetic field gradients whereby read-out signals traverse spirals in k-space, and
 c) means for driving the zero moment and first moment of the read-out gradients to zero after reading out signals, by applying spiral rewinders with built-in motion compensation to the read-out gradients, which are motion compensated rewinders, whereby fast imaging with steady precession (FISP) is realized without banding artifacts.

14. Apparatus as defined by claim 13 wherein the imaging is cardiac imaging.

15. Apparatus as defined in claim 13, wherein the imaging is in real time.

16. Apparatus as defined by claim 13 wherein element c) applies the motion compensated rewinders after the read-out magnetic field gradients.

17. Apparatus as defined by claim 16 wherein the motion compensated rewinders are integral with the read-out gradients.

18. Apparatus as defined by claim 16 wherein the motion compensated rewinders comprise separate compensation lobes.

19. Apparatus as defined by claim 16 wherein one rewinder is designed for a constant slew rate, S, a zero moment, $-M_0$, a first moment, $-M_1$, and with a time origin at the end of read-out and zero value spacing of $\tau_1$, $2\tau_2$, and $2\tau_3$ where $$\tau_1 = \frac{G_1}{S}$$
$$-\frac{M_0}{S} = \frac{1}{2}\tau_1^2 - \tau_2^2 + \tau_3^2$$
$$-\frac{M_1}{S} = \frac{1}{6}\tau_1^3 - \tau_2^2(\tau_1 + \tau_2) + \tau_3^2(\tau_1 + 2\tau_2 + \tau_3).$$

20. Apparatus as defined by claim 19 wherein another rewinder is designed for a constant slew rate, S, with a time origin at the end of read-out and zero value spacing of $2\tau_1$ and $2\tau_2$ where $$-\frac{M_0}{S} = \tau_1^2 - \tau_2^2$$
$$-\frac{M_1}{S} = \tau_1^3 - 2\tau_1\tau_2^2 - \tau_2^3.$$

21. Apparatus as defined by claim 20 wherein the zero moment, $M_0$, is:

$$M_0 = \int_{-T}^{0} G(t)\,dt$$

and the first moment, $M_1$, is:

$$M_1 = \int_{-T}^{0} tG(t)\,dt.$$

22. Apparatus as defined by claim 21 wherein the motion compensated rewinders are integral with the read-out gradients.

23. Apparatus as defined by claim 21 wherein the motion compensated rewinders comprise separate compensation lobes.

24. Apparatus as defined by claim 20 wherein flip angle is 60°, repetition time is 4.5 ms, imaged slice is 5-10 mm, and read-out gradients are 40 mT/m with 150 T/m/s slew rate.

* * * * *